United States Patent [19]
Daubert et al.

[11] Patent Number: 5,646,619
[45] Date of Patent: Jul. 8, 1997

[54] SELF-CALIBRATING HIGH SPEED D/A CONVERTER

[75] Inventors: Steven J. Daubert, Lincroft; Reza S. Shariatdoust, Califon, both of N.J.

[73] Assignee: Lucent Technologies Inc., Murray Hill, N.J.

[21] Appl. No.: 427,927

[22] Filed: Apr. 26, 1995

[51] Int. Cl.⁶ ........................................ H03M 1/06
[52] U.S. Cl. ................... 341/118; 341/120; 341/145
[58] Field of Search .................................. 341/118, 120, 341/145

[56] References Cited

U.S. PATENT DOCUMENTS

| | | | |
|---|---|---|---|
| 4,935,740 | 6/1990 | Schouwenhaars et al. | 341/135 |
| 5,021,784 | 6/1991 | Groeneveld et al. | 341/120 |
| 5,446,455 | 8/1995 | Brooks | 341/145 |

OTHER PUBLICATIONS

Groeneveld et al., "A Self-Calibration Technique For Monolithic High-Resolution D/A Converters", IEEE Journal of Solid State Circuits, vol. 24, No. 6, Dec. 1989, pp. 1517–1522.

Im et al., "Bandwidth-Efficient Digital Transmission Up To 155 Mb/s Over Unshielded Twisted Pair Wiring", IEEE, 1993, pp. 1797–1803.

Amrany et al., "FA 14.2: A Programmable DSP Engine for High-Rate Modems", IEEE International Solid-State Circuits Conference, 1992, pp. 222–223.

Lewis et al., "A 10-b 20-Msample/s Analog-to-Digital Converter", IEEE Journal of Solid-State Circuits, vol. 27, No. 3, Mar. 1992, pp. 351–358.

*Primary Examiner*—Jeffrey A. Gaffin
*Assistant Examiner*—Thuy-Trang N. Huynh

[57] ABSTRACT

A self-calibrating high speed D/A converter is provided with a calibration circuit for providing a fixed calibration current and a fixed calibration voltage during calibration mode, and a biasing circuit for biasing the calibration circuit with a first reference voltage and biasing the MSB and LSB array cells with a second reference voltage. By keeping the biasing voltage constant at the array cells during both calibrating and operating modes, such as 12 bits, the D/A converter effectively operates at high resolution, and at high operating speed.

20 Claims, 4 Drawing Sheets

SELF-CALIBRATING HIGH SPEED D/A CONVERTER

BACKGROUND OF THE INVENTION

1. Field of the Invention

This invention relates to a digital-to-analog (D/A) converter, more specifically a D/A converter which self calibrates and is biased to operate at high resolution and at high speed.

2. Discussion of Related Art

In D/A conversion designs intended for operation at higher speeds, such as at 10 Msample/second, transistor matching is often employed to achieve the desired resolution and accuracy. This approach proves successful to about 8–9 bits of resolution. In high speed applications requiring more than 8–9 bits performance, other techniques, such as laser trimming at wafer level, or dynamic calibration may be needed.

Dynamic calibration of voltages, currents or charges when converting from digital data to analog signals is typically performed to provide analog outputs proportional to digital input codes. Transistors are generally used to build up the desired voltage, current or charges which correspond to the actual digital input codes.

Several design techniques for achieving most significant bit (MSB) and least significant bit (LSB) calibration in D/A converters have been proposed. For example, U.S. Pat. No. 5,021,784 to Groeneveld et al. discloses a signal source arrangement which includes a group of calibrated signal sources, i.e., currents, where each signal source produces an identical unit signal. The unit signals are then combined to form an output signal. Each signal source also produces a similar undesirable spurious signal caused by the calibration procedure. The operating signal sources are calibrated successively and continuously to minimize the undesirable effect of the resulting spurious signals in the combined output signal.

A drawback in the prior art self-calibrating D/A designs is their lack of high resolution and accuracy at high operating speeds. This is because there exists a time interval, however small, where the operation voltages, currents or charges for an array of D/A cells is not equal to the calibration reference voltages, currents or charges. As a result, when operating the D/A converters at high speeds the operating voltages, currents or charges for each cell in the D/A array may be calibrated to be approximately equal to the voltage and current calibration reference points. The technique of fixing operating voltages, currents or charges for at least the MSB cells in the D/A array at values equal to the calibration reference values has been proposed. See "A Self-Calibration Technique For Monolithic High-Resolution D/A Converters" by Groeneveld et al., *IEEE Journal of Solid State Circuits*, Vol. 24, No. 6, December 1989, pages 1517–1522.

SUMMARY OF THE INVENTION

We have invented a D/A converter for converting a multi-bit digital signal input to an analog signal output. The D/A converter, which may be implemented in an integrated circuit, comprises a data array having a plurality of data cells; a calibration circuit for providing a fixed calibration current and a fixed calibration voltage during calibration mode; and a biasing circuit for biasing the calibration circuit with a first reference voltage and biasing each of the array cells with a second reference voltage. Each array cell includes a current sourcing device, a calibration transistor, first and second data selection switches, and first and second calibration switches.

During the calibration mode the current sourcing device sources a substantial portion of the total current through each cell. The fixed calibration voltage and current from the calibration circuit are applied to the calibration transistor through the first and second calibrating switches for forcing the calibrating transistor to source a remaining portion of the total current. The first and second data selector switches are commonly connected to the current sourcing device, the calibrating transistor, and one of the calibrating switches to form a common reference node. This node is kept at a fixed node voltage in relation to the fixed calibration voltage through one of the calibrating switches.

During the operation mode, the second reference voltage from the biasing circuit is applied through one of the data select switches to the common reference node to maintain that node at the fixed node voltage. A voltage referencing device in the biasing circuit supplies a reference voltage at the source of a biasing transistor. This reference voltage is equal to the first reference voltage minus the gate to source voltage of the biasing transistor.

Further features of the invention, its nature and various advantages will be more apparent from the accompanying drawings and the following detailed description of the invention.

DETAILED DESCRIPTION OF THE PREFERRED EMBODIMENT

Figure 1:
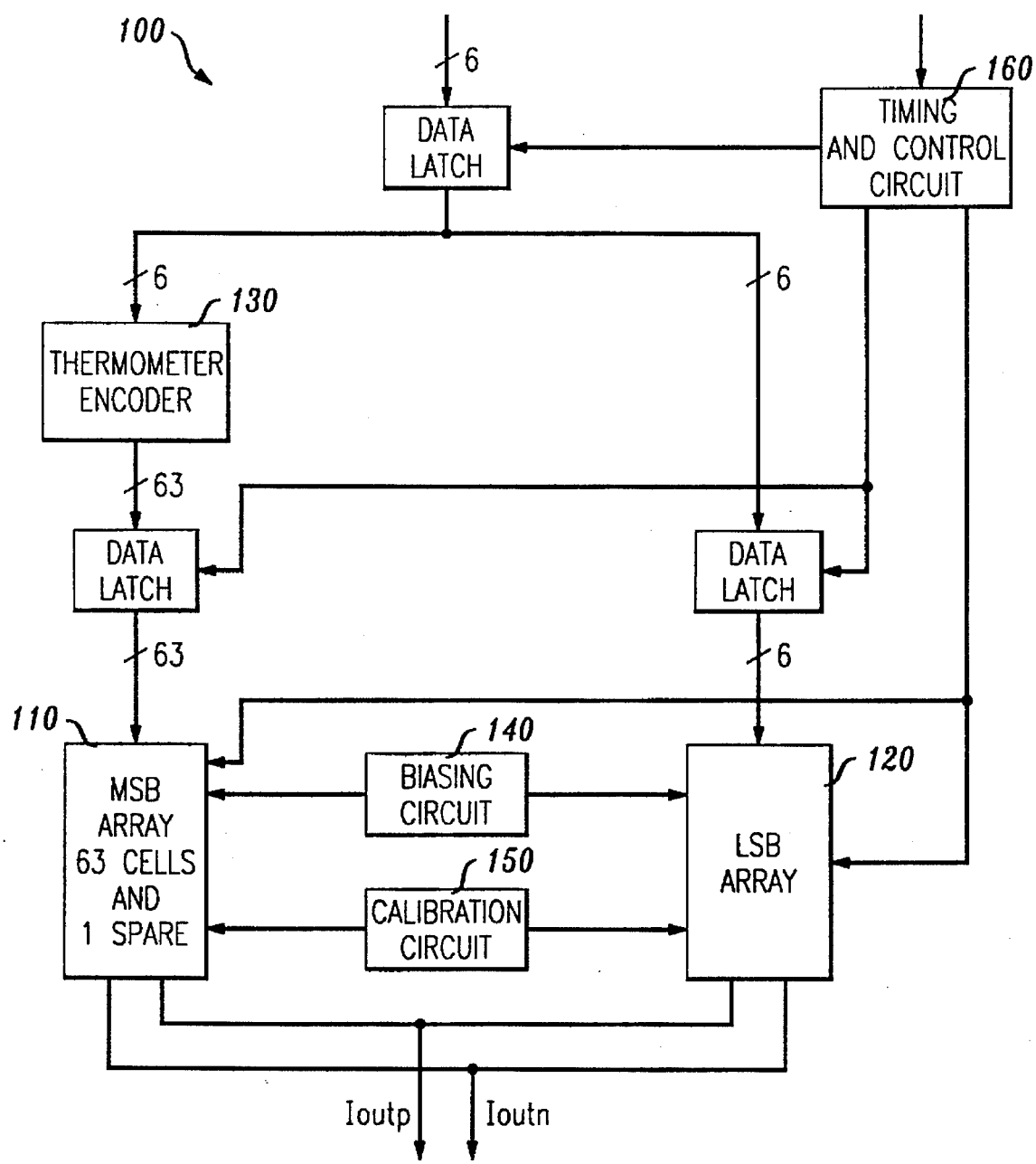
FIG. 1 is a block diagram of the D/A converter of an illustrative embodiment of the present invention.

The self-calibrating D/A converter according to a preferred embodiment of the present invention includes a biasing circuit for achieving high resolution and accuracy at high speeds. A block diagram of the D/A converter according to the present invention is shown in FIG. 1. It includes a most significant bit (MSB) array 110 and least significant bit (LSB) array 120, a thermometer encoder 130, a biasing circuit 140, a calibration circuit 150 and a timing and control circuit 160.

The MSB array 110 includes 63 data cells, each having a current source for supplying a current, $I_0$. The 6 MSBs of the 12-bit digital code is encoded by the thermometer encoder 130 into a 63-bit signal. The 63-bit signal then controls the direction of current flow of each cell in the MSB array 110. Meanwhile, the 6 LSBs of the 12-bit digital code control the LSB array 120, which consists of six binary weighted current sources.

The 63 cells of the MSB array 110 are switched either to a positive or a negative output, summed at resistors connected to the positive supply. There is also a 64th MSB cell, which is used as a spare cell, i.e. to replace the cell under calibration. The process of digital to analog conversion using MSB and LSB arrays 110 and 120, weighing and summing of signals encoded from the digital code input is well known to one ordinarily skilled in the art and is therefore not described in detail herein.

Figure 2:
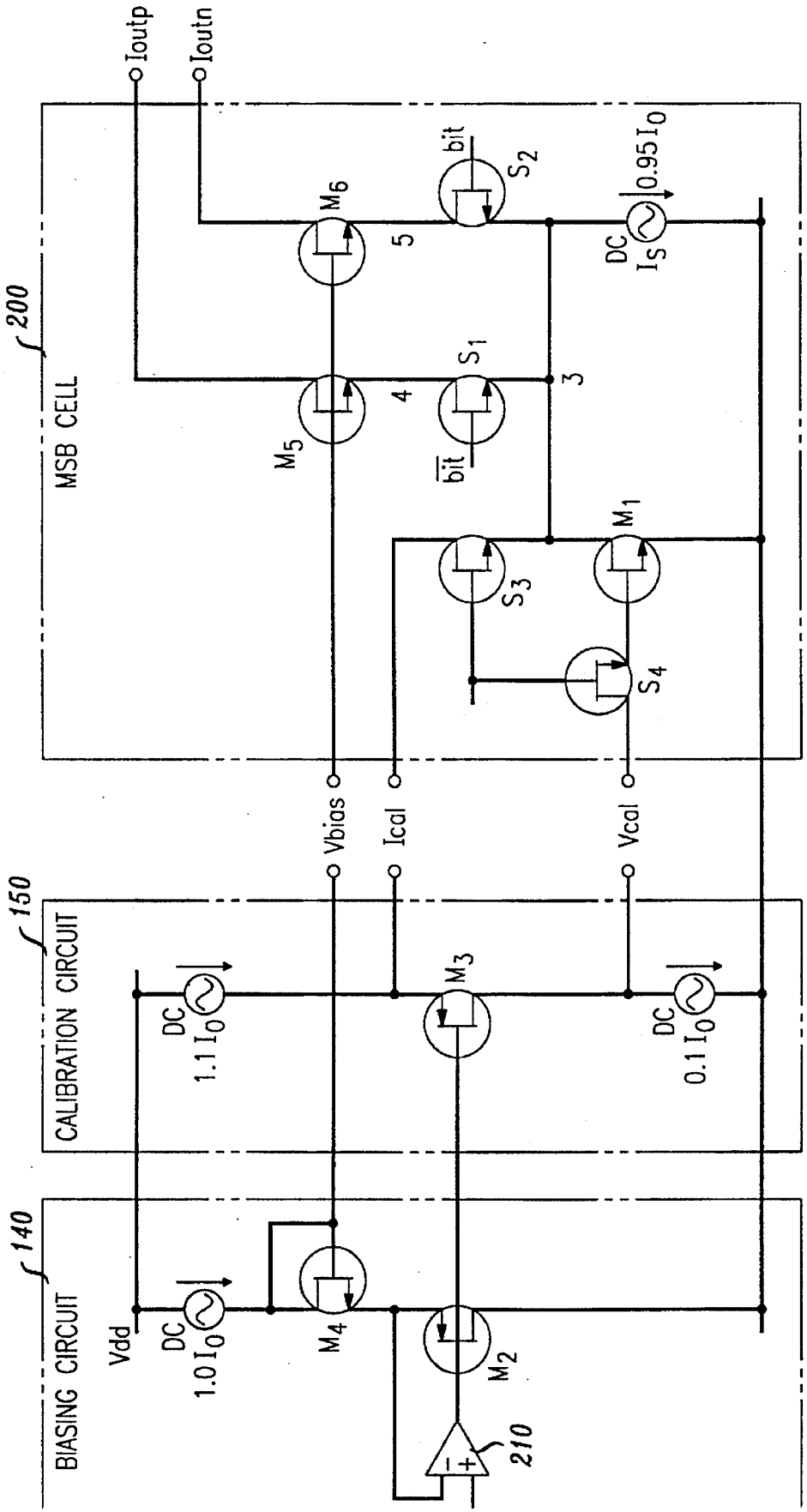
FIG. 2 is a schematic of an illustrative biasing circuit to calibrate the most and least significant bit array cells of the illustrative D/A converter in accordance with the present invention.

The biasing circuit 140, the calibration circuit 150, and a single MSB cell 200 are shown in FIG. 2. Only one MSB cell is shown for illustrative purposes. The supply voltage is symbolized by Vdd. The MSB cell 200 includs of a current source $I_s$ for supplying a substantial portion of a total output current $I_0$, calibration transistor $M_1$, data selector switches $S_1$ and $S_2$, and calibrating switches $S_3$ and $S_4$.

MSB Calibration

In the calibration mode, switches $S_1$ and $S_2$ are open, and switches $S_3$ and $S_4$ are closed. This forces a current $I_0$ through $S_3$ into $M_1$ and the current source of the cell 200. Since the current source provides a substantial amount of the total current $I_0$, for example , $0.95I_0$, the gate of $M_1$ will be forced to a voltage so that $M_1$ provides the remaining $0.05I_0$. With the same calibration circuit 150 used to calibrate every MSB cell, the mismatches in $M_1$ and the current source are corrected. Following calibration, switches $S_3$ and $S_4$ are opened, either $S_1$ or $S_2$ is closed, and $I_0$ flows from the positive or negative output (Ioutp or Ioutn).

An important aspect of D/A conversion at high speed is maintaining the voltage at node 3 at the same value during both the calibration and operation modes. This reduces error in the cell current due to variations in the $V_{DS}$ of $M_1$ and the current source, $I_s$, and it allows for a short calibration time, and thus higher operating speed. Since the biasing transistor $M_2$ and the calibration transistor $M_3$ are designed to be fabricated with $W/L_{M2}=10\ W/L_{M3}$ (i.e., the width to length ratio of transistor $M_2$ is ten times greater than the width to length ratio of transistor $M_3$) on the same integrated circuit chip and the transistors are commonly connected at their gates, the voltage of node $I_{cal}$, the calibration voltage output of the calibration circuit, is fixed at $V_{ref}$ during calibration; that is the voltage of node $I_{cal}$ is equal to $V_{ref}$.

The voltage at node 3 during calibration is then $$V_3 = V_{ref} - R_{on} I_0$$

where $R_{on}$ is the on-resistance of switch $S_3$.

In normal operation, the voltage at node 3 is determined by either the voltage at node 4 or node 5 and the resistance of switch $S_1$ or $S_2$. The transistors $M_4$, $M_5$ and $M_6$ are fabricated with the same scaling dimensions, i.e., $W/L_{M4} = W/L_{M5} = W/L_{M6}$ and the transistors are commonly connected at their respective gates at node $V_{bias}$, which has the potential $V_{bias} = V_{ref} + V_{GS}$ (where $V_{GS}$ is the source to gate voltage of $M_4$, $M_5$ or $M_6$). Node 4 or 5 will thus be held fixed at $V_{ref}$. The voltage at node 3 during operation is then $$V_3 = V_{ref} - R'_{on} I_0,$$

where $R'_{on}$ is the on-resistance of $M_5$ or $M_6$ and $V_{ref} = V_{bias} - V_{GS}$. THUS, $V_3$ during operation is the same as the voltage during calibration.

To illustrate further how the biasing circuit 140 keeps the voltages in each array cell fixed throughout the operation and calibration modes, the circuit depicted by FIG. 2 is hereinafter described with greater detail. Since $M_4$ is connected to the negative output of the op amp 210 or any voltage referencing device, the voltage at the source of transistor $M_4$ is equal to $V_{ref}$. Transistor $M_4$ is scaled to match transistors $M_5$ and $M_6$, such that the gate to source voltage of $M_4$ is equal to the gate to source voltage of transistor $M_5$ or $M_6$. Note that the transistors $M_4$, $M_5$, and $M_6$ are commonly connected at their respective gates and nodes 4 and 5 are at the source of transistors $M_5$ and $M_6$, respectively. $M_5$ and $M_6$ act as dive transistor for the data selection switches. $V_{Ical}$, connected to the source of $M_3$, is also fixed at $V_{ref}$ because transistors $M_2$ and $M_3$ are scaled and commonly connected at their respective gates and to the op amp 210. Thus, the gate to source voltage of $M_2$ is equal to the gate to source voltage of $M_3$ and $V_{ref}$ is present at the sources of $M_2$ and $M_3$. As a result, $V_{Ical}$, node 4 or 5 is equal to $V_{ref}$ voltage. The drains of transistors $M_3$ and $S_4$ are connected to common node $V_{cal}$. The current source $I_s$, switches $S_3$, $S_1$, and $S_2$, and transistor $M_1$ are commonly connected at node 3. Therefore, when one of these switches is on, one end of that on switch is connected to node 3, the current source, and the calibration transistor $M_1$, and the other end of that on switch is connected to either $I_{cal}$, node 4 or 5 which are, as discussed above, at the same voltage.

Consequently, with the addition of the biasing circuit 140, the voltage at node 3 is kept constant throughout the calibration and operation modes. As a result, the D/A converter achieves high resolution at high speeds.

LSB Calibration

Figure 3:
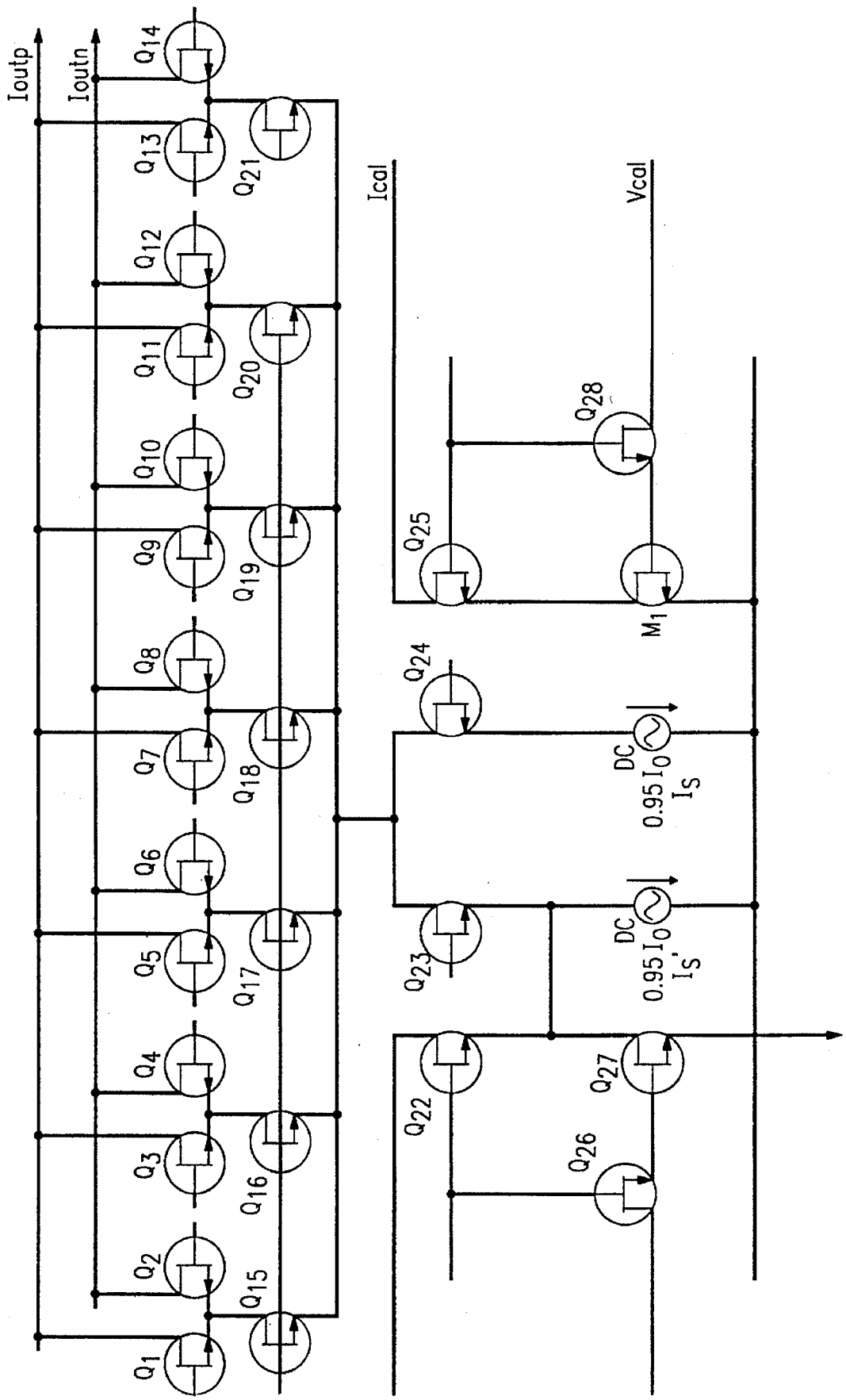
FIG. 3 is a schematic of the least significant bit array of the illustrative D/A converter.

A simplified schematic of the LSB array 120 is shown in FIG. 3. LSB array 120 includes transistors $Q_1-Q_{28}$ and $M_1$ inerconnected as shown. The LSB currents are derived from further dividing one MSB current source into binary weighted finer current sources. Here the current source $I_S$ and transistor $M_l$ are identical to those in any cell in the MSB array 110.

In MSB calibration, there is a spare cell that replaces the cell being calibrated. However, using the same approach for the LSB portion of the D/A would imply a duplicate LSB array. Instead the LSB array calibration is completed without replacing complete arrays, but rather the current source and calibration transistor $M_1$ are duplicated. During one calibration clock period, the left-hand current source is calibrated, while the right-hand source provides current to the array. During the next calibration clock period, the cells are exchanged and the process repeated.

As in the MSB array 110, the biasing circuit 140 is designed to maintain a constant voltage across the current sources $I_S$ and $I_S$ during calibration and normal operation to improve speed and accuracy. This is achieved by commonly connecting or scaling the transistors connected to $V_{bias}$. The maintenance of a constant voltage increases the speed of calibration.

Figure 4:
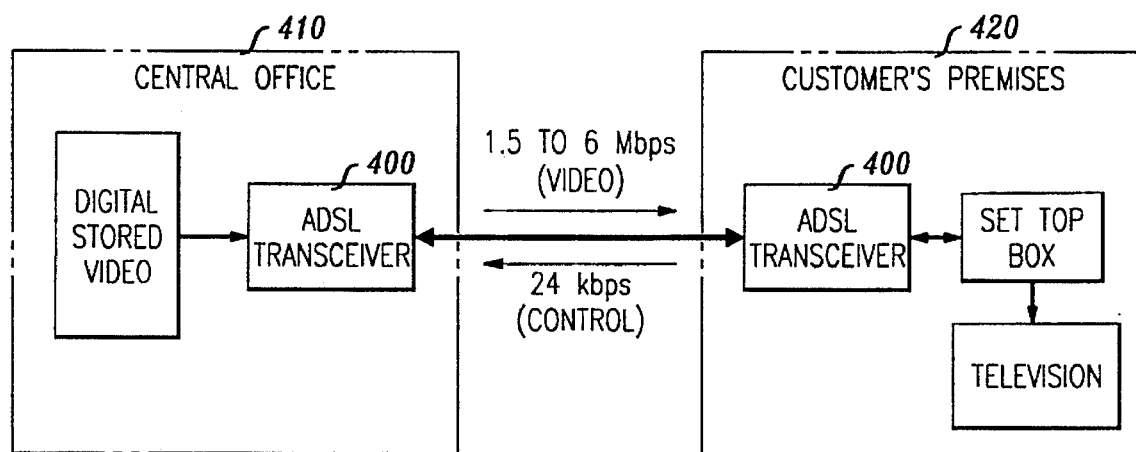
FIG. 4 is a block diagram of an illustrative application of the self-calibrating D/A converter of the present invention, namely as incorporated in an asymmetric digital subscriber line.

The high speed, high resolution self-calibrating D/A converter is hereinafter discussed with reference to FIGS. 4 and 5 in the context of a 5 V ADSL transceiver CMOS chip 400 designed for applications involving digital subscriber lines, such as the high speed and asymmetric digital subscriber lines which may be used to deliver information from a central office 410 to a customer's premises 420. However, the implementation of the present invention in the 5 V CMOS chip 400 is for illustrative and exemplary purposes only.

The 5 V CMOS chip 400 includes an A/D converter 510, a transmit filter 520, a receive filter 530, a programmable gain amplifier 540, and the self-calibrating D/A converter of the present invention. The A/D and D/A converters are a 12-bit, 10 Msample/sec converters. The A/D converter is described in the March 1992 issue of the *IEEE Journal of Solid-State Circuits*, vol. 27, pp. 351–358, the contents of which are incorporated herein by reference. The programmable gain amplifier 540 has 48 dB gain with a 1.7 MHz bandwidth. When used in an E1-rate (2.048 Mbps) asymmetric digital subscriber line transceiver, the chip 400 achieves a bit error rate of less than $10^{-9}$ over 5.65 km of 0.5 mm twisted copper wire.

Figure 5:
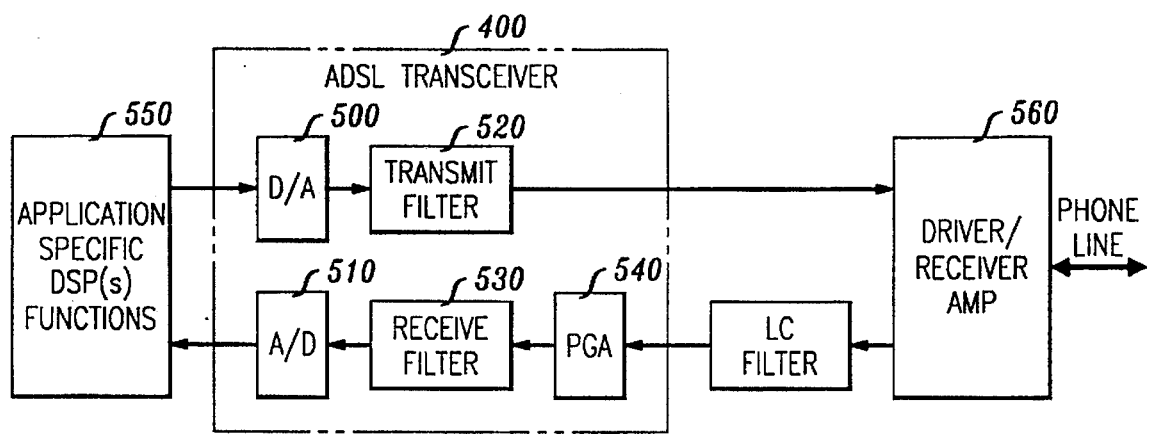
FIG. 5 is a block diagram of an illustrative architecture of the asymmetric digital subscriber line transceiver.

FIG. 5 shows the transceiver 400 partitioned into a multichip solution with the integration of the digital signal processing (DSP) functions 550. These DSP functions 550 are described in the February 1992 issue of the *ISSCC Digest of Technical Papers*, vol.35, pp. 222–223, the contents of which are incorporated herein by reference. The analog portion of the transceiver 400 consists of two chips, the one having the D/A converter of the present invention, and a chip having a line driver/receiver amplifier 560. Each of the blocks within the analog front end illustrated by FIG. 5 are described in more detail hereinafter with particular emphasis on the workings of the self-calibrating D/A converter.

Transmit (Reconstruct) Filter

Following the D/A converter of the present invention in the transmit path is a lowpass filter 520 designed to remove the images of the transmitted spectrum that occur at multiples of the sampling frequency. By operating the D/A 100 at four times the sampling rate, the filter 520 is simplified, reducing noise and improving linearity. The transmit filter 520 is fourth order, implemented as cascade of two second order Rauch filters followed by a buffer to drive the external load. This filter 520 is trimmed at wafer level to reduce variations due to resistor and capacitor processing, and the 3 dB frequency is programmable to support the T1/E1 digital subscriber line.

Receiver (Anti-aliasing) Filter

Like the transmit filter 520, the anti-alias or receive filter 530 is a lowpass filter. Here the filter removes high frequency noise that would otherwise be aliased into the signal band by the sampling of the A/D converter 510. Again, the order of filter depends on the frequency of the signal passband and the sampling frequency. A digital decimator and oversampling of the A/D by a factor of four is preferred for simplifying the anti-alias filter 530. This also improves the signal to noise performance of the A/D converter 510. The 3 dB frequency of the resulting forth order filter is programmable to support the T1/E1 digital subscriber line applications. The implementation is similar to the transmit filter 520.

Programmable Gain Amplifier

For the high speed digital subscriber line, the received signal occupies the same frequency band as the transmitted signal, while for asymmetric digital subscriber line it occupies a different band. These two differing systems create two different requirements for receiver gain. For E1-rate (2 Mbps) asymmetric digital subscriber line, the signal may pass through a channel consisting of as much as 4.25 km of 0.4 mm copper wire for a 2 Mbps (E1-rate) system. This corresponds to a 60 dB mid band loss, with more than 85 dB loss at the high end of the band. To compensate for such a channel, the programmable gain amplifier 540 is designed to combine high gain and wide bandwidth, while maintaining a high input impedance and an input noise voltage of less than (10 nV) /√Hz. The gain of the programmable gain amplifier 540 is partitioned to the three stages, one having 30 dB gain with 6 dB steps, one with 15 dB gain with 3 dB steps, and one with 3 dB with 0.3 dB steps.

It will be understood that each of the elements described above, or two or more together, may also find a useful application in other types of constructions differing from the type described above.

While the invention has been illustrated and described as embodied in a 5V CMOS transceiver chip for applications involving digital subscriber lines, it is not intended to be limited to the details shown, since it will be understood that various omissions, modifications, substitutions and changes in the forms and details of the device illustrated and in its operation can be made by those skilled in the art without departing in any way from the spirit of the present invention.

What is claimed as new and desired to be protected by Letters Patent is set forth in the appended claims:

1. An integrated circuit having a digital-to-analog (D/A) converter for converting a multi-bit digital signal input to an analog signal output, comprising:

a data array having a plurality of data cells;

a calibration circuit for providing a fixed calibration current and a fixed calibration voltage during calibration mode;

a biasing circuit for biasing said calibration circuit with a first reference voltage and biasing each of said data cells with a second reference voltage;

wherein each of said data cells includes a current sourcing device, a calibrating transistor, first and second data selection switches, and first and second calibrating switches;

whereby during calibration mode said current sourcing device sources a substantial portion of the total current through said cell, said fixed calibration voltage and current from said calibration circuit are applied to said calibrating transistor through said first and second calibrating switches for forcing said calibrating transistor to source a remaining portion of the total current, and said first and second data selection switches being commonly connected to said current sourcing device, said calibrating transistor, and one of said calibrating switches to form a common reference node, which is kept at a fixed node voltage in relation to said fixed calibration voltage through said one of said calibrating switches; and whereby during operation mode, said second reference voltage from said biasing circuit is applied through one of said data selection switches to said common reference node to maintain said node at said fixed node voltage.

2. The integrated circuit according to claim 1, wherein said biasing circuit includes a voltage referencing device for providing a fixed voltage and first and second biasing transistors for providing said first and second reference voltages.

3. The integrated circuit according to claim 2, wherein said calibration circuit includes a calibration transistor having fabrication dimensions which are scaled to said first biasing transistor of said biasing circuit, and adapted so that the input nodes of said first biasing transistor and said calibration transistor are commonly connected to provide a fixed calibration voltage output equal to said fixed voltage of said voltage referencing device.

4. The integrated circuit according to claim 2, wherein said first and second data selection switches and said first calibrating switch in each of said data cells have equal fabrication dimensions for equalizing the voltage and current performance characteristics therein.

5. The integrated circuit according to claim 2, wherein each of said data cells further includes first and second drive transistors, being connected to said first and second data selection switches, said drive transistors for providing current drive outputs.

6. The integrated circuit according to claim 5, wherein said first and second drive transistors and said second biasing transistor of said biasing circuit have scaled fabrication dimensions for providing proportionally scaled voltage and current performance characteristics, and said drive transistors and said second biasing transistor are commonly connected at their respective gate inputs.

7. The integrated circuit as in claim 1, wherein said data array comprises of most significant bit and least significant bit data cells and wherein during calibration mode said most significant bit and least significant bit data cells are calibrated.

8. The integrated circuit as in claim 7, wherein during calibration of said most significant bit arrays a spare data cell is used to replace a data cell under calibration.

9. The integrated circuit as in claim 7, wherein said least significant bit data cells include first and second current sources and first and second calibrating transistors wherein during one calibration clock period said first current source is calibrated while the second current source provides current to said least significant bit data cell and during a second calibration clock period said least significant bit data cell is exchanged for another least significant bit data cell in said data array.

10. A digital-to-analog signal (D/A) converter for converting a multi-bit digital data signal to an analog signal output, comprising:
    a data array having a plurality of data cells, each representing a weighted portion of said digital data signal;
    calibration means for providing a calibrating voltage output and a calibrating current output to each of said data cells;
    biasing means including a reference voltage device for providing a fixed voltage reference; and
    each of said data cells further including:
        first and second data selection switches for receiving complementary input data and switching in accordance with the input data, said switches being commonly connected to current sourcing means and calibrating means to form a cell reference node, wherein during calibration mode, said calibrating voltage and calibrating current outputs from said calibration means are applied to said calibrating means for calibrating said current sourcing means, said calibrating means further includes means for affixing said cell reference node at a node voltage having a fixed relation to said fixed voltage reference of said biasing circuit during said calibration mode and operation.

11. The D/A converter as in claim 10, wherein said data array comprises of most significant bit and least significant bit data cells and wherein during calibration mode said most significant bit and least significant bit data cells are calibrated.

12. The D/A converter as in claim 11, wherein during calibration of said most significant bit arrays a spare data cell is used to replace a data cell under calibration.

13. The D/A converter as in claim 11, wherein said least significant bit data cells include first and second current sources and first and second calibrating transistors wherein during one calibration clock period said first current source is calibrated while the second current source provides current to said least significant data cell and during a second calibration clock period said least significant bit data cell is exchanged for another least significant bit data cell in said data array.

14. A digital-to-analog signal (D/A) converter for converting a multi-bit digital data signal to an analog signal output, comprising:
    a data array having a plurality of data cells, each representing a weighted portion of said digital data signal;
    calibration means for providing a calibrating voltage output and a calibrating current output to each of said data cells;
    biasing means including a voltage referencing device for providing a fixed voltage reference, said biasing means further including first and second biasing transistors for providing first and second biasing voltages, said first biasing voltage being applied to said calibration means and said second biasing voltage being applied to each of said data cells; and
    each of said data cells further including:
        data inputting means being commonly connected to current sourcing means and calibrating means to form a cell reference node, wherein during calibration mode, said calibrating voltage and calibrating current outputs from said calibration means are applied to said calibrating means for calibrating said current sourcing means, said calibrating means further includes means for affixing said cell reference node at a node voltage having a fixed relation to said fixed voltage reference of said biasing circuit during said calibration mode and operation.

15. The D/A converter according to claim 14, wherein said calibration means includes a calibration transistor having fabrication dimensions which are scaled to said first biasing transistor of said biasing means, and adapted so that the input nodes of said first biasing transistor and said calibration transistor are commonly connected to provide a fixed calibration voltage output equal to said fixed voltage reference of said voltage referencing device.

16. The D/A converter according to claim 14, wherein said means for affixing includes first and second data selection switches and a first calibrating switch have equal fabrication dimensions for equalizing the voltage and current performance characteristics therein.

17. The D/A converter according to claim 16, wherein said means for affixing in each of said data cells further includes first and second drive transistors, being connected to said first and second data selection switches, said drive transistors for providing current drive outputs.

18. The D/A converter according to claim 17, wherein said first and second drive transistors and said second biasing transistor of said biasing circuit have scaled fabrication dimensions for providing proportionally scaled voltage and current performance characteristics, and said drive transistors and said second biasing transistor are commonly connected at their respective gate inputs.

19. A method for converting a multi-bit digital signal input to an analog signal output, comprising:
    providing a calibration circuit, said calibration circuit providing a fixed calibration current and a fixed calibration voltage during calibration mode to a data array having a plurality of data cells;
    biasing said calibration circuit with a first reference voltage and biasing each of said data cells with a second reference voltage, wherein each of said array cells includes a current sourcing device, a calibrating transistor, first and second data selection switches, and first and second calibrating switches;
    whereby during calibration mode said current sourcing device sources a substantial portion of the total current through said cell, said fixed calibration voltage and current from said calibration circuit are applied to said calibrating transistor through said first and second calibrating switches for forcing said calibrating transistor to source a remaining portion of the total current, and said first and second data selection switches being commonly connected to said current sourcing device, said calibrating transistor, and one of said calibrating switches to form a common reference node, which is kept at a fixed node voltage in relation to said fixed calibration voltage through said one of calibrating switches; and applying during operation mode, said second reference voltage from said biasing circuit through one of said data selection switches to said common reference node to maintain said node at said fixed node voltage.

20. A method for converting a multi-bit digital signal input to an analog signal output as in claim 19, wherein said plurality of data cells include most significant bit and least significant bit data cells, wherein a most significant bit data cell is replaced with a spare cell before being calibrated, wherein each least significant bit data cell includes a pair of calibrating transistors and first and second current sources, wherein during one calibration clock period said first current source is calibrated, while the second current source provides current to said data cell, wherein during a second calibration clock period said data cell is exchanged for another data cell and the process is repeated.

* * * * *